United States Patent
O'Sullivan

(10) Patent No.: US 9,337,380 B2
(45) Date of Patent: May 10, 2016

(54) METHOD FOR FABRICATING HETEROJUNCTION INTERDIGITATED BACK CONTACT PHOTOVOLTAIC CELLS

(71) Applicant: IMEC VZW, Leuven (BE)

(72) Inventor: Barry O'Sullivan, Ezemaal (BE)

(73) Assignee: IMEC VZW, Leuven (BE)

( * ) Notice: Subject to any disclaimer, the term of this patent is extended or adjusted under 35 U.S.C. 154(b) by 100 days.

(21) Appl. No.: 14/218,416

(22) Filed: Mar. 18, 2014

(65) Prior Publication Data

US 2014/0295613 A1 Oct. 2, 2014

(30) Foreign Application Priority Data

Mar. 19, 2013 (EP) ...................................... 13159878

(51) Int. Cl.
*H01L 31/20* (2006.01)
*H01L 31/0224* (2006.01)
(Continued)

(52) U.S. Cl.
CPC .............. *H01L 31/20* (2013.01); *H01L 31/028* (2013.01); *H01L 31/02167* (2013.01); *H01L 31/022425* (2013.01); *H01L 31/022441* (2013.01); *H01L 31/022458* (2013.01); *H01L 31/0352* (2013.01); *H01L 31/03762* (2013.01);
(Continued)

(58) Field of Classification Search
CPC ................... H01L 31/0682; H01L 31/022441; H01L 31/0443; H01L 31/02167; H01L 31/0516; H01L 31/022425; H01L 21/02592; H01L 21/76256; H01L 31/022458; Y02E 10/548
See application file for complete search history.

(56) References Cited

U.S. PATENT DOCUMENTS 5,431,777 A 7/1995 Austin et al.
6,132,592 A 10/2000 Yamasaki et al.
(Continued)

OTHER PUBLICATIONS

Steinsland et al., "Boron Etch-Stop in TMAH Solutions," IEEE, The 8th International Conference on Solid-State Sensors and Actuators, and Eurosensors IX, Stockholm, Sweden, Jun. 25-29, 1995, pp. 190-193.

(Continued)

*Primary Examiner* — Bac Au
(74) *Attorney, Agent, or Firm* — Knobbe, Martens, Olson & Bear LLP

(57) ABSTRACT

The disclosed technology generally relates photovoltaic devices, and more particularly to methods of fabricating heterojunction interdigitated back contact photovoltaic cells having interdigitated emitter regions and back surface field regions. In one aspect, a method of forming on a substrate a patterned n+ a-Si:H layer and a patterned p+ a-Si:H layer, the patterned n+ a-Si:H layer and the patterned p+ a-Si:H layer being interdigitated and electrically isolated from each other, the method comprising: forming a patterned p+ a-Si:H layer on the substrate, the patterned p+ a-Si:H layer covering first regions of the substrate surface and leaving second regions of the substrate surface exposed; depositing a first intrinsic a-Si:H layer on the substrate; depositing an n+ a-Si:H layer on the first intrinsic a-Si:H layer; providing a patterned masking layer covering the n+ a-Si:H layer at least in the second regions; and selectively removing the n+ a-Si:H layer and the first intrinsic a-Si:H layer in regions not covered by the masking layer and stopping at an underlying portion of the p+ a-Si:H layer substantially without removing a substantial amount of the underlying portion of the p+ a-Si:H layer, wherein selectively removing the n+ a-Si:H layer and the first intrinsic a-Si:H layer comprises etching in a solution comprising a diluted TMAH solution.

17 Claims, 5 Drawing Sheets

(51) Int. Cl.
*H01L 31/05* (2014.01)
*H01L 31/0443* (2014.01)
*H01L 31/0216* (2014.01)
*H01L 31/068* (2012.01)
*H01L 31/18* (2006.01)
*H01L 31/028* (2006.01)
*H01L 31/0352* (2006.01)
*H01L 31/0376* (2006.01)
*H01L 31/0747* (2012.01)
*H01L 21/762* (2006.01)
*H01L 21/02* (2006.01)

(52) U.S. Cl.
CPC ....... *H01L 31/0443* (2014.12); *H01L 31/0516* (2013.01); *H01L 31/0682* (2013.01); *H01L 31/0747* (2013.01); *H01L 31/1804* (2013.01); *H01L 31/202* (2013.01); *H01L 21/02592* (2013.01); *H01L 21/76256* (2013.01); *Y02E 10/547* (2013.01); *Y02E 10/548* (2013.01); *Y02P 70/521* (2015.11)

(56) References Cited

U.S. PATENT DOCUMENTS

| | | |
|---|---|---|
| 7,737,357 B2 | 6/2010 | Cousins |
| 9,105,769 B2 * | 8/2015 | Chan ............... H01L 31/022441 |
| 2002/0001960 A1 | 1/2002 | Wu et al. |
| 2009/0293948 A1 | 12/2009 | Tucci et al. |

OTHER PUBLICATIONS

Steinsland et al., "Etch rates of (100), (111) and (110) single-crystal silicon in TMAH measured in situ by laser reflectance interferometry," Sensors and Actuators 86, 2000, pp. 73-80.

Xuefeng, D., "Microfabrication Using Bulk Wet Etching with TMAH," Thesis for Master of Science, McGill University, Aug. 31, 2005.

* cited by examiner

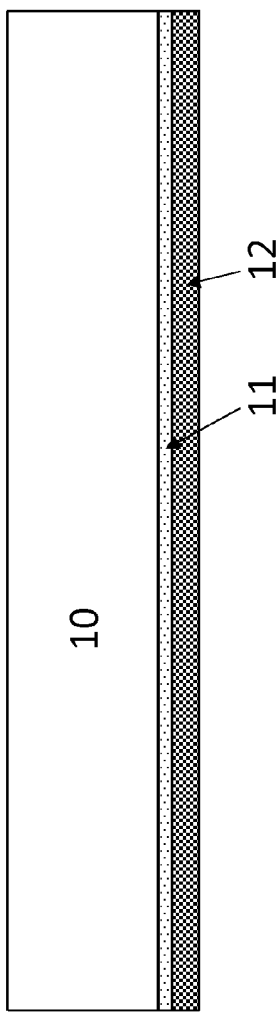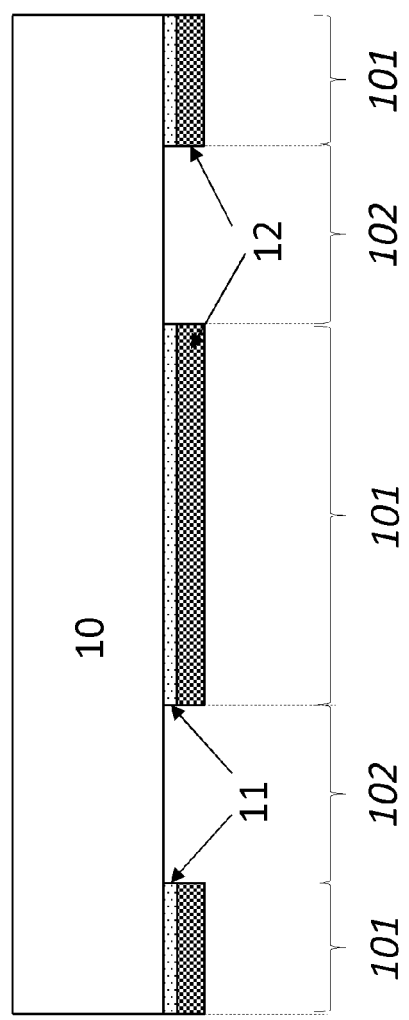

METHOD FOR FABRICATING HETEROJUNCTION INTERDIGITATED BACK CONTACT PHOTOVOLTAIC CELLS

CROSS-REFERENCE TO RELATED APPLICATIONS

This application claims foreign priority to European patent application EP 13159878.1 filed on Mar. 19, 2013, the content of which is incorporated by reference herein in its entirety.

BACKGROUND OF THE INVENTION

1. Field of the Invention

The disclosed technology generally relates to photovoltaic devices, and more particularly to methods of fabricating heterojunction interdigitated back contact photovoltaic cells having interdigitated emitter regions and back surface field regions.

2. Description of the Related Technology

Photovoltaic devices comprising interdigitated back contact (IBC) cells can improve efficiency of the photovoltaic devices by having electrical contacts formed at the rear side of the cell. By having the electrical contacts formed at the rear side of the cell, shading effects that can result from electrical contacts formed in the front side of the cell can be reduced or eliminated, thereby increasing the overall photovoltaic conversion efficiency. In an IBC cell, interdigitated n+ regions (e.g. forming a back surface field region) and p+ regions (e.g. forming an emitter region) and corresponding interdigitated n-type contacts and p-type contacts are typically used at the rear side of the cell.

In silicon heterojunction IBC cells, the emitter regions and the back surface field regions are formed by providing an appropriately doped amorphous silicon layer on a crystalline silicon substrate (amorphous silicon/crystalline silicon heterostructure). The p+ regions are formed by locally providing a p+-type amorphous silicon layer on a crystalline substrate according to a first pattern, and the n+ regions are formed by locally providing an n+-type amorphous silicon layer according to a second pattern, the first pattern and the second pattern being interdigitated.

When fabricating such silicon heterojunction IBC cells, there is a need for providing a good electrical isolation and thus avoiding parasitic shunts between the patterned n+ amorphous silicon layer and the patterned p+ amorphous silicon layer.

For example, in US 2009/0293948 a method is described wherein isolation between the n-type a-Si:H (hydrogenated amorphous silicon) layer and the p-type a-Si:H layer is realized by depositing a very thin intrinsic buffer layer after patterning the n-type a-Si:H layer and before depositing the p-type a-Si:H layer. This method comprises: depositing on a crystalline silicon substrate an intrinsic a-Si:H buffer layer and an n-type doped a-Si:H layer over the whole surface of the substrate; fixing a metallic mask on which a comb shaped grid has been opened on the n-type doped a-Si:H covered crystalline silicon wafer; patterning the n-type a-Si:H layer, the patterning comprising removing the n-type a-Si:H not covered by the mask by a dry etching procedure; depositing a thin intrinsic buffer layer through the mask; and depositing a p-type doped a-Si:H layer through the same mask. In a production environment, the use of a metallic mask is disadvantageous because the metallic mask needs to be attached or fixed to the substrate, and needs to be cleaned or replaced regularly because a-Si:H layers are deposited on the mask.

In U.S. Pat. No. 7,737,357 a method is described wherein separation between the n-type a-Si:H layer and the p-type a-Si:H layer is realized by means of a silicon oxide layer that is deposited by a low pressure chemical vapor deposition process. Providing the silicon oxide layer requires an additional deposition step, which may affect the p-type a-Si:H layer on which it is deposited.

SUMMARY OF CERTAIN INVENTIVE ASPECTS

Certain inventive aspects relate to methods for forming on a substrate a patterned $n^+$ a-Si:H layer and a patterned $p^+$ a-Si:H layer, the $n^+$ a-Si:H layer and the $p^+$ a-Si:H layer being interdigitated and electrically isolated from each other, wherein the methods require less process steps as compared to known methods, and wherein the methods are suitable for being used in a production environment. The methods can advantageously be used for forming interdigitated emitter regions and back surface field regions in a fabrication process for silicon heterojunction interdigitated back contact photovoltaic cells.

A method according to an inventive aspect for forming on a substrate a patterned $n^+$ a-Si:H layer and a patterned $p^+$ a-Si:H layer, the patterned $n^+$ a-Si:H layer and the patterned $p^+$ a-Si:H layer being interdigitated and electrically isolated from each other, further preferably lying within a same plane, comprises: forming a patterned $p^+$ a-Si:H layer on the substrate, the patterned $p^+$ a-Si:H layer covering first regions of the substrate surface and leaving second regions of the substrate surface exposed; depositing a first intrinsic a-Si:H layer on the substrate (for instance covering the substrate); depositing an $n^+$ a-Si:H layer on the first intrinsic a-Si:H layer (for instance covering the a-Si:H layer); providing a patterned masking layer covering the $n^+$ a-Si:H layer at least in the second regions; and performing an etching step in a diluted TMAH solution, thereby locally removing the $n^+$ a-Si:H layer and the underlying first intrinsic a-Si:H layer in the regions not covered by the masking layer and leaving the underlying $p^+$ a-Si:H layer substantially unaffected.

Leaving the $p^+$ a-Si:H layer substantially unaffected means that this layer is not etched or etched at a substantially lower etch rate as compared to the $n^+$ a-Si:H layer and the first intrinsic a-Si:H layer, e.g. at an etch rate that is at least a factor of 100 lower. Therefore a good etch selectivity between the different layers is obtained and the etch process is self-limiting.

The etching step can be done by wet etching in a diluted TMAH (Tetramethylammonium Hydroxide) solution, preferably at ambient temperature, such as e.g. at a temperature in the range between 15° C. and 30° C., e.g. at a temperature in the range between 15° C. and 25° C., the present disclosure not being limited thereto. The diluted TMAH solution can for example contain about 1% to about 10% TMAH, e.g. about 1% to about 5% TMAH, the present disclosure not being limited thereto. The TMAH solution is preferably a water based solution, i.e. comprises water or further comprises only water. It was surprisingly found that using such diluted TMAH solution allows obtaining a very good etch selectivity, thus enabling a self-limiting process which locally etches the $n^+$ a-Si:H and intrinsic a-Si:H layers and which substantially stops etching at exposed surfaces of the $p^+$ a-Si:H layer.

In some embodiments, any native oxide that may be present at the surface of the $n^+$ a-Si:H layer is removed before performing the diluted TMAH etching step. Removing a native oxide may be done by any suitable method known by a person skilled in the art, such as for example by performing a diluted HF dip.

In a method of the present disclosure, forming a patterned p+ a-Si:H layer can comprise depositing a non-patterned p+ a-Si:H layer and afterwards patterning the p+ a-Si:H layer using methods known to a person skilled in the art.

In an inventive aspect the method may further comprise depositing a second intrinsic a-Si:H layer before depositing the p+ a-Si:H layer. The second intrinsic a-Si:H layer can be patterned according to the same pattern as the p+ a-Si:H layer.

In some embodiments, the p+ a-Si:H layer has a thickness in the range between 5 nm and 50 nm and a doping level (e.g. boron doping) in the range between $10^{20}$ cm$^{-3}$ and $10^{22}$ cm$^{-3}$.

The first intrinsic a-Si:H layer deposited after forming the patterned p+ a-Si:H layer is at least provided in the exposed substrate regions (second regions). In advantageous embodiments it is a non-patterned layer, covering the patterned p+ a-Si:H layer in the first regions and covering the exposed substrate surface in the second regions. The thickness of this layer is preferably in the range between 1 nm and 10 nm.

In some embodiments, the n+ a-Si:H layer has a thickness in the range between 5 nm and 50 nm and a doping level (e.g. phosphorous doping) in the range between $10^{20}$ cm$^{-3}$ and $10^{22}$ cm$^{-3}$.

A method of the present disclosure can advantageously be used for forming interdigitated emitter regions and back surface field regions in a fabrication process for silicon heterojunction interdigitated back contact (IBC) photovoltaic cells. In such fabrication process, the substrate is a crystalline silicon substrate, such as e.g. a monocrystalline, a multicrystalline or a polycrystalline silicon substrate. In some embodiments the substrate is an n-type silicon substrate, the present disclosure not being limited thereto. When using an n-type silicon substrate, the patterned p+ a-Si:H layer forms emitter regions of the heterojunction IBC cell and the patterned n+ a-Si:H layer forms back surface field (BSF) regions of the cell. The emitter regions and the BSF regions are interdigitated and electrically isolated from each other by the first intrinsic a-Si:H layer deposited after providing the patterned p+ a-Si:H layer. It is an advantage that the first intrinsic a-Si:H layer can provide a good electrical isolation between the p+ doped regions and the n+ doped regions, resulting in a shunt resistance higher than 1000 Ohm·cm$^2$.

Certain objects and advantages of various inventive aspects have been described herein above. Of course, it is to be understood that not necessarily all such objects or advantages may be achieved in accordance with any particular embodiment of the disclosure. Thus, for example, those skilled in the art will recognize that the disclosure may be embodied or carried out in a manner that achieves or optimizes one advantage or group of advantages as taught herein without necessarily achieving other objects or advantages as may be taught or suggested herein. Further, it is understood that this summary is merely an example and is not intended to limit the scope of the disclosure. The disclosure, both as to organization and method of operation, together with features and advantages thereof, may best be understood by reference to the following detailed description when read in conjunction with the accompanying drawings.

BRIEF DESCRIPTION OF THE DRAWINGS

FIGS. 2 to 6 are cross sectional views of a photovoltaic cell at various stages of fabrication, according to a method in some embodiments.

Figure 1:
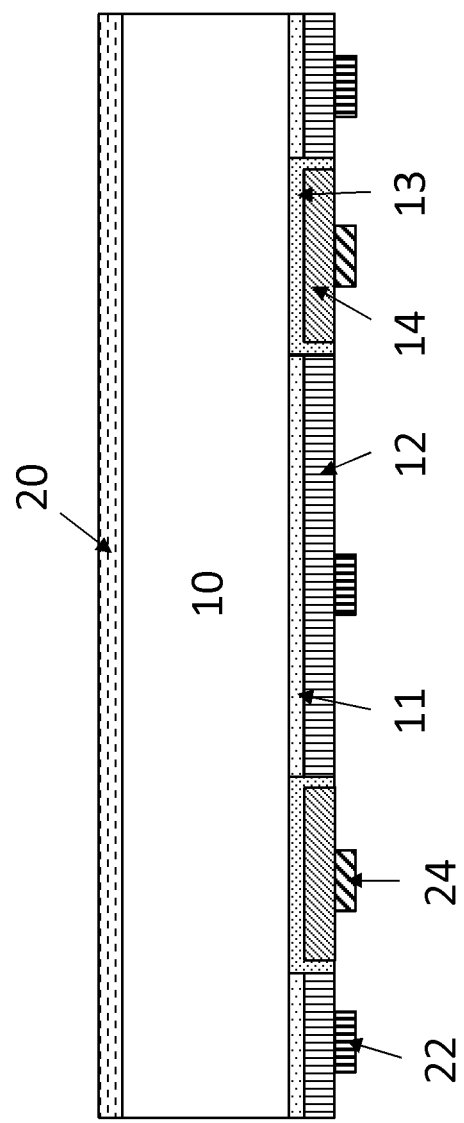
FIG. 1 is a cross-sectional view of a photovoltaic cell, according to some embodiments.

In the different drawings, the same reference signs refer to the same or analogous elements.

DETAILED DESCRIPTION OF CERTAIN ILLUSTRATIVE EMBODIMENTS

In the following detailed description, numerous specific details are set forth in order to provide a thorough understanding of the disclosure and how it may be practiced in particular embodiments. However, it will be understood that the present disclosure may be practiced without these specific details. In other instances, well-known methods, procedures and techniques have not been described in detail, so as not to obscure the present disclosure. While the present disclosure will be described with respect to particular embodiments and with reference to certain drawings, the disclosure is not limited hereto. The drawings included and described herein are schematic and are not limiting the scope of the disclosure. It is also noted that in the drawings, the size of some elements may be exaggerated and, therefore, not drawn to scale for illustrative purposes.

Moreover, the terms top, bottom, over, under and the like in the description are used for descriptive purposes and not necessarily for describing relative positions. It is to be understood that the terms so used are interchangeable under appropriate circumstances and that the embodiments of the disclosure described herein are capable of operation in other orientations than described or illustrated herein.

In the context of the present disclosure, the front surface or front side of a photovoltaic cell or of a substrate is the surface or side adapted for being oriented towards a light source and thus for receiving illumination. The back surface, rear surface, back side or rear side of a photovoltaic cell or of a substrate is the surface or side opposite to the front surface or side.

In the context of the present disclosure, structures that are interdigitated includes arrangements in which the structures are intermingled or interlocked, for example, arrangements in which items from one group and items from another group are formed alternately. As used herein in the context of photovoltaic cells, interdigitation can refer to such arrangements as they relate to back contacts of a photovoltaic cell, and to emitter regions and back surface field (BSF) regions of an interdigitated back contact (IBC) photovoltaic cell. The interdigitated electrodes, the interdigitated emitter regions and the BSF regions can, for example, include comb-shaped or finger-shaped regions, e.g. a plurality of finger-shaped elements.

The present disclosure related to methods for forming on a substrate a patterned n+ a-Si:H layer and a patterned p+ a-Si:H layer, the n+ a-Si:H layer and the p+ a-Si:H layer being interdigitated and electrically isolated from each other. The methods of the present disclosure can advantageously be used in a fabrication process for silicon heterojunction interdigitated back contact (IBC) photovoltaic cells, more in particular for forming interdigitated emitter regions and back surface field (BSF) regions at the rear side of silicon heterojunction IBC cells.

FIG. 1 is a cross sectional view of a heterojunction interdigitated back contact photovoltaic cell, according to some embodiments. The cell comprises electrical contacts including base contacts 24 to BSF regions 14 and emitter contacts 22 to emitter regions 12, formed at the rear side of the cell. The substrate 10 comprises a crystalline silicon substrate, such as for example a monocrystalline, a multicrystalline or a polycrystalline silicon substrate. The BSF regions 14 and the emitter regions 12 are formed of hydrogenated amorphous silicon (a-Si:H). In some embodiments, the substrate 10 comprises an n-type substrate, the BSF regions 14 includes an n-type a-Si:H layer, e.g. having a thickness in the range between 5 nm and 50 nm, and the emitter regions 12 includes a p-type a-Si:H layer, e.g. having a thickness in the range between 5 nm and 50 nm. In some embodiments, the cell further comprises at least one of a first thin intrinsic a-Si:H layer 13 and a second thin intrinsic a-Si:H layer 11. When present, the first thin intrinsic a-Si:H layer 13 is formed at the interface between the BSF regions 14 and the silicon substrate 10, and/or the second thin intrinsic a-Si:H layer 11 is formed at the interface between the emitter regions 12 and the silicon substrate 10. In some embodiments, the thicknesses of the first thin intrinsic a-Si:H layer 13 and the second thin intrinsic a-Si:H layer 11 are in the range between about 1 nm and about 10 nm. As used herein, an intrinsic a-Si:H layer refers to an amorphous silicon layer that is not doped or not doped intentionally. However, it will be appreciated that in general, a semiconductor material including an a-Si:H material can include a relatively low level of doping as deposited, resulting from, for example, impurities in the precursors used to deposit the semiconductor material. In some embodiments described herein, the intrinsic a-Si:H layer 11 has a doping level below about $10^{12}$ cm$^{-3}$.

Advantageously, the at least one of a first thin intrinsic a-Si:H layer 13 and a second thin intrinsic a-Si:H layer 11 can provide a surface passivation effect on the surface of the substrate 10, which can be formed of crystalline silicon. In some embodiments, the emitter regions 12 and the BSF regions 14 can include finger-shaped or comb-shaped regions and can be interdigitated. In the illustrated embodiment of the cell in FIG. 1, the BSF regions 14 and the emitter regions 12 are electrically isolated from each other by the first intrinsic a-Si:H layer 13. Also the base contacts 24 and the emitter contacts 22 are for example finger-shaped or comb-shaped and interdigitated, in accordance with the pattern of the BSF regions 14 and the emitter regions 12 respectively. In the illustrated embodiment in FIG. 1, the cell additionally comprises an antireflection coating 20 at the front side. In some embodiments, at the interface between the antireflection coating 20 and the silicon substrate 10, a surface passivation layer can be present (not shown for clarity). Additionally, in some embodiments, the front surface of the substrate 10 can be textured (not shown) and a front surface field can be provided at the front side of the cell (not shown for clarity).

The present disclosure provides a fabrication method for a photovoltaic cell as shown in FIG. 1. FIGS. 2 to 6 are cross sectional views of a heterojunction interdigitated back contact photovoltaic cell at various states of fabrication, according to some embodiments.

First, referring to FIG. 2, a second intrinsic a-Si:H layer 11 is deposited on the rear surface of a crystalline silicon substrate 10, followed by deposition of a p-type doped a-Si:H layer 12 on the second intrinsic a-Si:H layer 11, according to some embodiments. The doping level of the p-type doped a-Si:H layer 12 can be in the range between about $10^{20}$ cm$^{-3}$ and about $10^{22}$ cm$^{-3}$. The thickness of the p-type doped a-Si:H layer 12 can be in the range between about 5 nm and about 50 nm. In the following, for illustrative purposes only, disclosed embodiments include a crystalline silicon substrate 10 having an n-type doping. In such embodiments, the p-type doped a-Si:H layer 12 can used to form an emitter region of the photovoltaic cell. However, the present disclosure is not limited thereto, and the silicon substrate 10 can also be p-doped, and the p-type doped a-Si:H layer 12 can be used to form a BSF region of the photovoltaic cell.

Next, referring to FIG. 3, after depositing the p-type doped a-Si:H layer 12, the p$^+$ a-Si:H layer 12 and the second intrinsic a-Si:H layer 11 are patterned, thereby removing these layers at locations where BSF regions are to be formed (second regions 102) and leaving the layers only at locations where emitter regions are to be formed (first regions 101), according to some embodiments. Patterning can be done using known techniques in the art such as, for example, by lithography or by laser ablation or by other suitable methods known by a person skilled in the art.

Figure 4:
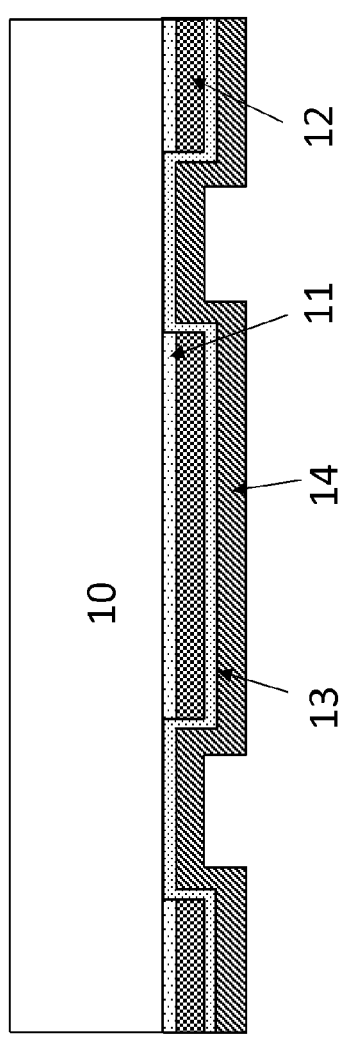

Referring to FIG. 4, after patterning layers 11 and 12, a first intrinsic a-Si:H layer 13 and an n-type doped a-Si:H layer 14 (e.g., n$^+$ a-Si:H layer having a doping level in the range between about $10^{20}$ cm$^{-3}$ and about $10^{22}$ cm$^{-3}$ and a thickness in the range between 5 nm and 50 nm) are deposited at the rear side of the substrate, according to some embodiments. The first intrinsic a-Si:H layer 13 provides a good separation and electrical isolation between the p-type doped a-Si:H layer 12 and the n-doped a-Si:H layer 14. According to some embodiments, the first intrinsic a-Si:H layer 13 is configured to provide a shunt resistance between the p-type doped a-Si:H layer 12 and the n-doped a-Si:H layer 14 having a minimum value of selected to be at least about 3800 Ohm·cm$^2$, which can be measured based on dark current voltage characteristics of a cell similar to the cell illustrated in FIG. 1, which may be fabricated according to the methods described herein. It will be appreciated that the shunt resistance between the p-type doped a-Si:H layer 12 and the n-doped a-Si:H layer 14 having the minimum selected value indicates a good electrical separation and electrical isolation between the p-type doped a-Si:H layer 12 and the n-doped a-Si:H layer 14.

Figure 5:
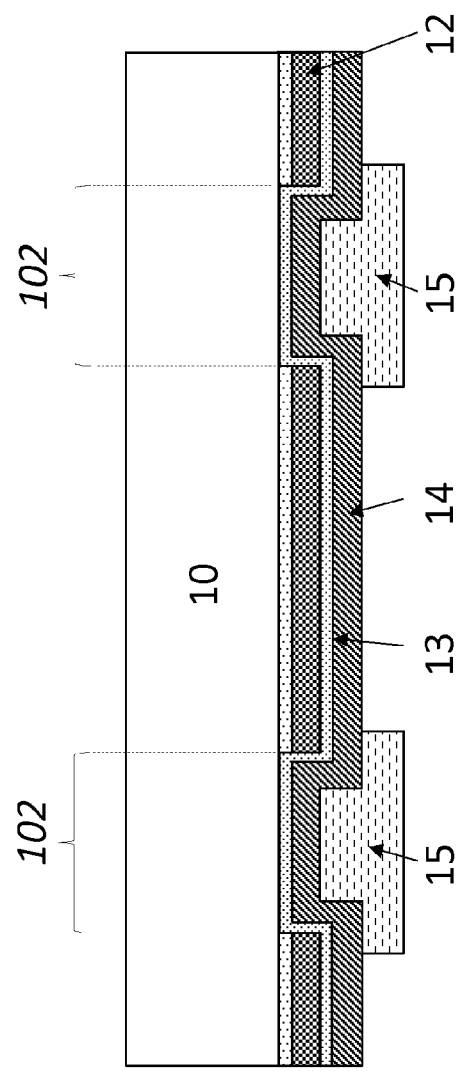
Figure 6:
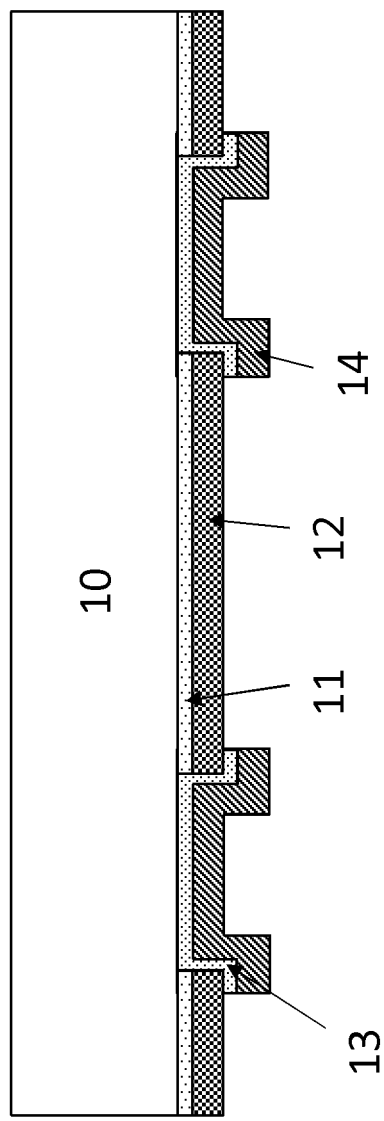

Referring to FIGS. 5 and 6, after depositing the first intrinsic a-Si:H layer 13 and the n$^+$ a-Si:H layer 14, the first intrinsic a-Si:H layer 13 and the n$^+$ a-Si:H layer 14 are patterned, according to some embodiments. In the illustrated embodiment, patterning the first intrinsic a-Si:H layer 13 and the n$^+$ a-Si:H layer 14 includes forming a masking layer 15 which covers at least the locations where BSF regions are to be formed (second regions 102). In some embodiments, masking layer 15 extends over the second regions 102 (i.e. the masking layer 15 is preferably wider than the second regions), which can advantageously provide a margin for alignment and avoid problems that may occur due to under-etching in a further process step. The masking layer 15 can, for example, be formed and patterned by using lithography and/or using screen printing processes utilizing, e.g., a polymer paste.

Referring to FIG. 5, according to some embodiments, after forming the masking layer 15, the n$^+$ a-Si:H layer 14 and the first intrinsic a-Si:H layer 13 are locally selectively etched using an etch process having a relatively high etch selectivity, or a relatively high ratio of etch rates, between the etch rates of n$^+$ a-Si:H layer 14 and the first intrinsic a-Si:H layer 13 and the etch rate of the p$^+$ a-Si:H layer 12. In the illustrated embodiment, the etch selectivity of the etch process is sufficiently high such that after etching through the n$^+$ a-Si:H layer 14 and further through the first intrinsic a-Si:H layer 13, the etch process stops at the p$^+$ a-Si:H layer 12 without removing a substantial amount of the p$^+$ a-Si:H layer 12. It will be appreciated that the amount of the p$^+$ a-Si:H layer 12 removed can depend on a ratio between etch rates of at least one of the n$^+$ a-Si:H layer 14 and the first intrinsic a-Si:H layer 13, and the etch rate of the p$^+$ a-Si:H layer 12. In some embodiments, the ratio can exceed about 100, about 130 or about 150. In some other embodiments, the ratio is between about 130 and 170, or between about 150 and 170, for instance about 150. It will be appreciated that such high ratio exceeding at least about 100 can be advantageous in designing etch processes, by allowing for complete removal of the $n^+$ a-Si:H layer 14 and the first intrinsic a-Si:H layer 13 from different regions of the substrate, which can have materials having varying etch rates, by building in an additional etch time (sometimes referred to as an overetch) into the etch processes, without removing substantial amounts of $p^+$ a-Si:H layer 12. By way of an example, an example, an additional etch time that can nominally remove 100 nm of a combined thickness of the $n^+$ a-Si:H layer 14 and the first intrinsic a-Si:H layer 13 can, for example, remove less than 1 nm of $p^+$ a-Si:H layer 12. In some embodiments, prior to locally selectively etching the $n^+$ a-Si:H layer 14 and the first intrinsic a-Si:H layer 13, native oxide that may be present at the surface of the $n^+$ a-Si:H layer 14 is removed. For example, a dilute HF or other processes known to remove native oxides can be used. In some embodiments, the local etching is performed using a wet etching process, e.g., wet etching in a diluted TMAH (Tetramethylammonium Hydroxide) solution at ambient temperature. For example, the local etching can be performed at a temperature in the range between 15° C. and 30° C., and the diluted TMAH solution can include, for example, about 1% to about 10% TMAH in water. It was surprisingly found that such diluted TMAH solution etches intrinsic a-Si:H and $n^+$ a-Si:H much faster (at least a factor of 100 faster) than $p^+$ a-Si:H. It was found that a very good selectivity can be obtained, thus enabling a self-limiting process which locally etches $n^+$ a-Si:H layer 14 and first intrinsic a-Si:H layer 13 and which substantially stops etching at the exposed surface of the $p^+$ a-Si:H layer 12.

Referring to FIG. 6, after selectively etching the $n^+$ a-Si:H layer 14 and the first intrinsic a-Si:H layer 13, the masking layer 15 is removed. Next, metal contacts are provided at the rear side, more in particular base contacts 24 in electrical contact with the BSF regions 14 and emitter contacts 22 in electrical contact with the emitter regions 12.

Figure 7:
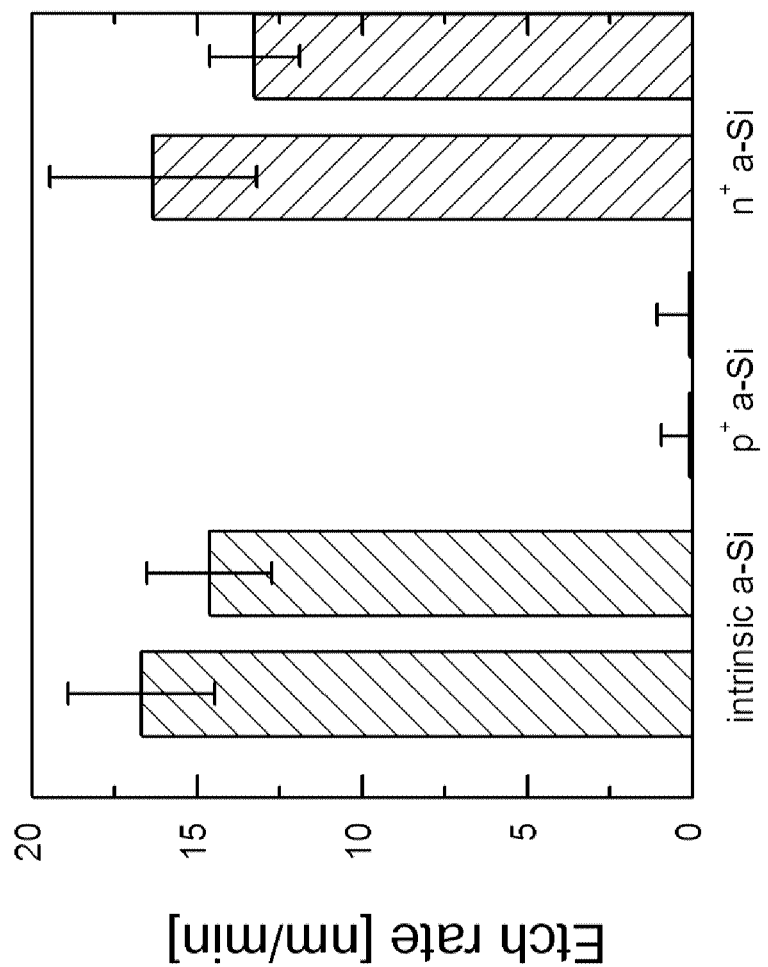
FIG. 7 is a bar graph showing measured etch rates of various doped and undoped a-Si:H layers used in fabricating a photovoltaic cell, according to some embodiments.

FIG. 7 shows actual etch rates measured for intrinsic a-Si:H, $n^+$ a-Si:H and $p^+$ a-Si:H layers. The measurements were made by first performing a dip in 1% HF for 30 seconds, followed by etching in a 1% TMAH solution for 60 seconds. The etch rates in FIG. 7 show the average and the spreading for 49 measurement points per wafer. For the intrinsic a-Si:H layers and the $n^+$ a-Si:H layers etch rates in the range between about 13 nm/min and 17 nm/min were measured, for instance about 15 nm/min. For the $p^+$ a-Si:H layers an etch rate in the order of 0.1 nm/min was obtained. It can be concluded that the etch rate of the $p^+$ a-Si:H layers is substantially lower, i.e. about a factor of at least 130, or at least 150 or at least 170 lower than the etch rate for the intrinsic a-Si:H and $n^+$ a-Si:H layers. Therefore a very good etch selectivity is obtained and the etch process is self-limiting.

It is an advantage of the good etch selectivity towards $p^+$ a-Si:H that the thickness and thus the conductivity of the $p^+$ a-Si:H layer can be maintained, and therefore the device performance is not negatively affected by the etching process.

A method for fabricating heterojunction IBC cells can comprise further process steps, such as for example texturing the front surface of the substrate, and/or providing a front surface field region and/or a surface passivation layer and/or an antireflection coating at the front side of the cells. Providing the surface passivation layer and/or the antireflection coating can be done at the beginning of the process flow, i.e. before depositing a-Si:H layers, or it can be done at a later stage, e.g. just before providing the rear side emitter contacts and base contacts.

Although the method of the present invention for forming a patterned $n^+$ a-Si:H layer and a patterned $p^+$ a-Si:H layer is described above in the context of a fabrication process for heterojunction IBC cells, the present disclosure is not limited thereto. For example, the method of the present invention may also be used in a fabrication process for homojunction IBC cells, wherein the patterned $n^+$ a-Si:H layer and the patterned $p^+$ a-Si:H layer may be used as a dopant source for forming $n^+$ doped regions and $p^+$ doped regions in a crystalline silicon substrate.

The foregoing description details certain embodiments of the disclosure. It will be appreciated, however, that no matter how detailed the foregoing appears in text, the disclosure may be practiced in many ways. It should be noted that the use of particular terminology when describing certain features or aspects of the disclosure should not be taken to imply that the terminology is being re-defined herein to be restricted to including any specific characteristics of the features or aspects of the disclosure with which that terminology is associated.

What is claimed is:

1. A method of forming on a substrate a patterned $n^+$ a-Si:H layer and a patterned $p^+$ a-Si:H layer, the patterned $n^+$ a-Si:H layer and the patterned $p^+$ a-Si:H layer being interdigitated and electrically isolated from each other, the method comprising:
    forming a patterned $p^+$ a-Si:H layer on the substrate, the patterned $p^+$ a-Si:H layer covering first regions of the substrate surface and leaving second regions of the substrate surface exposed;
    depositing a first intrinsic a-Si:H layer on the substrate;
    depositing an $n^+$ a-Si:H layer on the first intrinsic a-Si:H layer;
    providing a patterned masking layer covering the $n^+$ a-Si:H layer at least in the second regions; and
    selectively removing the $n^+$ a-Si:H layer and the first intrinsic a-Si:H layer in regions not covered by the masking layer and stopping at an underlying portion of the $p^+$ a-Si:H layer without removing a substantial amount of the underlying portion of the $p^+$ a-Si:H layer,
    wherein selectively removing the $n^+$ a-Si:H layer and the first intrinsic a-Si:H layer comprises etching in a solution comprising a diluted tetramethylammonium hydroxide (TMAH) solution.

2. The method of claim 1, wherein selectively removing the $n^+$ a-Si:H layer and the first intrinsic a-Si:H layer comprises etching the $n^+$ a-Si:H layer and the first intrinsic a-Si:H layer at etch rates that are at least a factor of 100 higher than an etch rate of the $p^+$ a-Si:H layer.

3. The method of claim 1, wherein selectively removing comprises etching in the diluted TMAH solution having about 1% to about 10% TMAH.

4. The method of claim 1, wherein etching in the solution comprises etching at a temperature in the range between about 15° C. and about 30° C.

5. The method of claim 1, further comprising removing a native oxide before selectively removing the $n^+$ a-Si:H layer and the first intrinsic a-Si:H layer.

6. The method of claim 1, further comprising providing a second intrinsic a-Si:H layer on the substrate before depositing the $p^+$ a-Si:H layer.

7. The method of claim 6, wherein forming a patterned $p^+$ a-Si:H layer comprises depositing an unpatterned $p^+$ a-Si:H layer and subsequently patterning the unpatterned $p^+$ a-Si:H layer, and wherein the second intrinsic a-Si:H layer is patterned according to the same pattern as the $p^+$ a-Si:H layer.

8. The method of claim 1, wherein the p⁺ a-Si:H layer has a thickness in the range between about 5 nm and about 50 nm and a doping level in the range between about $10^{20}$ cm$^{-3}$ and about $10^{22}$ cm$^{-3}$.

9. The method of claim 1, wherein the first intrinsic a-Si:H layer has a thickness in the range between about 1 nm and about 10 nm.

10. The method of claim 1, wherein the n⁺ a-Si:H layer has a thickness in the range between 5 nm and 50 nm and a doping level in the range between about $10^{20}$ cm$^{-3}$ and about $10^{22}$ cm$^{-3}$.

11. The method of claim 1, wherein the substrate comprises a crystalline silicon substrate.

12. A method for fabricating silicon heterojunction interdigitated back contact photovoltaic cells, comprising forming on a crystalline silicon substrate a patterned n⁺ a-Si:H layer and a patterned p⁺ a-Si:H layer, the patterned n⁺ a-Si:H layer and the patterned p⁺ a-Si:H layer being interdigitated and electrically isolated from each other, of claim 1, wherein the patterned n⁺ a-Si:H layer forms back surface field (BSF) regions of the cell and wherein the patterned p⁺ a-Si:H layer forms emitter regions of the cell.

13. A method of claim 12, further comprising providing base contacts in electrical contact with the BSF regions and emitter contacts in electrical contact with the emitter regions.

14. A method of fabricating a photovoltaic cell, comprising:
   forming a first amorphous semiconductor material on a substrate, wherein forming the first amorphous semiconductor material comprises depositing a p-doped a-Si:H layer;
   patterning the first amorphous semiconductor material to form a recess interposed between adjacent patterned first amorphous semiconductor layers;
   forming a second amorphous semiconductor material in the recess and on the first amorphous semiconductor layers, wherein forming the second amorphous semiconductor material comprises depositing an undoped a-Si:H layer on sidewalls of the recess and further comprises depositing an n-doped a-Si:H layer on the undoped a-Si:H layer, such that the undoped a-Si:H layer deposited on the sidewalls of the recess is interposed between and electrically separates the n-doped a-Si:H layer in the recess from the first amorphous semiconductor layers; and
   removing the second amorphous semiconductor material from at least portions of surfaces of the patterned first amorphous semiconductor layers,
   wherein removing the second amorphous semiconductor material comprises removing using an etchant adapted to selectively remove the second amorphous semiconductor material at a removal rate substantially faster than a removal rate of the first amorphous semiconductor layers, such that a thickness of the first amorphous semiconductor layers remain substantially unchanged after removing the second amorphous semiconductor material.

15. The method of claim 14, wherein removing using an etchant includes using an etchant adapted to selectively remove the second amorphous semiconductor material at a removal rate faster than a removal rate of the first amorphous semiconductor layers by a factor exceeding 100.

16. The method of claim 14, wherein removing using an etchant includes wet etching in a diluted tetramethylammonium hydroxide (TMAH) solution having about 1% to about 10% by volume of TMAH.

17. The method of claim 15, wherein removing using an etchant includes etching at a temperature in the range between about 15° C. and about 30° C.

* * * * *